United States Patent [19]

Ahlm et al.

[11] Patent Number: 5,518,120

[45] Date of Patent: May 21, 1996

[54] ANTI-STATIC PACKAGE FOR PROTECTING SENSITIVE ELECTRONIC COMPONENTS FROM ELECTROSTATIC CHARGES

[75] Inventors: Bradley G. Ahlm, Excelsior; Paul A. Granning, Ramsey, both of Minn.

[73] Assignee: Conductive Containers Inc., Northbrook, Ill.

[21] Appl. No.: 359,571

[22] Filed: Dec. 20, 1994

[51] Int. Cl.[6] ................................................ H05F 1/02
[52] U.S. Cl. ................................................ 206/719; 206/460
[58] Field of Search ................................................ 206/701, 709, 206/719, 721, 460, 524.1, 524.3, 813

[56] References Cited

U.S. PATENT DOCUMENTS

| | | |
|---|---|---|
| 2,534,201 | 12/1950 | Hutter . |
| 3,048,515 | 8/1962 | Dalton . |
| 4,160,503 | 7/1979 | Ohlbach . |
| 4,211,324 | 7/1980 | Ohlbach . |
| 4,293,070 | 10/1981 | Ohlbach . |
| 4,424,900 | 1/1984 | Petcavich . |
| 4,480,747 | 11/1984 | Kazor et al. . |
| 4,482,048 | 11/1984 | Blodgett . |
| 4,564,880 | 1/1986 | Christ et al. .......................... 206/719 X |
| 4,606,790 | 8/1986 | Youngs et al. . |
| 4,610,353 | 9/1986 | Young . |
| 4,684,020 | 8/1987 | Ohlbach . |
| 4,699,830 | 10/1987 | White . |
| 4,706,438 | 11/1987 | Ohlbach . |
| 4,883,172 | 11/1989 | Young . |
| 4,909,901 | 3/1990 | McAllister et al. . |
| 4,966,280 | 10/1990 | Bradford . |
| 4,966,281 | 10/1990 | Kawanishi et al. .................. 206/719 X |
| 5,014,849 | 5/1991 | Becker . |
| 5,041,319 | 8/1991 | Becker et al. . |
| 5,090,563 | 2/1992 | Becker . |
| 5,102,712 | 4/1992 | Peirce et al. . |
| 5,107,989 | 4/1992 | Becker . |
| 5,246,730 | 9/1993 | Peirce et al. . |

FOREIGN PATENT DOCUMENTS

WO90/15760  12/1990  WIPO .

OTHER PUBLICATIONS

3M Product Data Sheet for anti–static utility tape.
Klockner Pentaplast of America, Inc., physical properties data sheet for vinyl rigid film.
15 photographs of an anti–static package. The source was a presently obscure supplier for NCR Corporation.
Early anti–static package prototype.
A second early anti–static package prototype.

*Primary Examiner*—Jacob K. Ackun
*Attorney, Agent, or Firm*—Arnold, White & Durkee

[57] ABSTRACT

An anti-static package for containing and manipulating an electronic component susceptible to damage from electrostatic charges. The anti-static package is comprised of a container body and a lid, wherein the lid is adapted to allow indirect manipulation of the electronic component through the use of an adhesive surface on a compressible member attached to the lid to form an adhesive bond between the lid and the electronic component, and two camming surfaces, controlled by a user's fingers or an analogous tool The adhesive is specially selected for both its anti-static properties and the lack of residue left on the electronic component as a result of forming an adhesive bond.

22 Claims, 5 Drawing Sheets

5,518,120

ANTI-STATIC PACKAGE FOR PROTECTING SENSITIVE ELECTRONIC COMPONENTS FROM ELECTROSTATIC CHARGES

FIELD OF THE INVENTION

The present invention relates generally to containers for electronic components, more particularly, to containers for protecting such electronic components from electrostatic discharges and from the fields that emanate from electrostatic charges.

BACKGROUND OF THE INVENTION

When two surfaces are brought in contact with each other, a transfer of electrons may occur resulting in a residual static electrical charge when the surfaces are separated. This phenomena is known as triboelectricity or generally as static electricity. As surfaces move in contact past each other, significant electrostatic charges can be built up on the surfaces, thereby creating strong electric fields.

One of the problems associated with sensitive electronic components is that the fields or discharge of even a relatively small electrostatic charge in close proximity to the component can damage the component. For example, an electrostatic charge on a surface of the electronic component or on the surface of a user can be discharged when that user comes into contact with the device. Such a discharge can destroy the sensitive circuitry internal to the device.

To provide protection from electrostatic discharge, it is well known in the art to place sensitive electronic components into anti-static packaging that employs the Faraday cage effect. The Faraday cage effect relies on the fact that electricity generally does not penetrate a conductive enclosure, but rather the electrical discharge will go around the enclosed space, perhaps on the surface of the enclosure, seeking the path of least electrical resistance en route to the lower potential it is pursuing.

A Faraday cage is recognized in the art as a substantially enclosed, at least partially conductive, structure. By substantially surrounding a static sensitive device with an electrically conductive or electrostaticly dissipative enclosure, the device is shielded from damaging electrostatic charges originating outside of the enclosure. Electrostatic dissipative materials have been generally defined as having a surface resistivity of between $10^5$ and $10^{12}$ ohms/square.

However, such anti-static packaging must respond to other variables in the environment in which it is actually used. For example, the electronic component is typically inserted inside the packaging and later removed from the packaging for use. Both insertion and removal of the electronic component provide an opportunity for a electrostatic discharge, especially if a human operator is involved. Thus it is important to reduce the risk of damage by electrostatic charges when the component is inserted into an anti-static package and again when that user or another user removes the electronic component from the anti-static package. By keeping the component away from direct contact with any user inserting or removing the device from the anti-static package, the opportunity for a destructive electrical discharge via the user is reduced. A variety of methods have been employed to reduce the risk of damage by electrostatic charges when a user is manipulating an electronic component, but these typically require the user to use other devices or tools other than the package itself to manipulate the object. It would be advantageous to provide a mechanism to allow the user manipulating the electrical component to use the anti-static package itself to reduce the risk of damage by electrostatic charges. It would alto be desirable to do so without creating any significant additional electrostatic charges. Furthermore, the package should be easier to manipulate than existing packages with anti-static features.

Another problem encountered in packaging electronic components is that many such components include leads extending beyond the surface of the component. Particularly in surface-mount technology, chip leads are often so small and closely spaced together that even a relatively minor contact between the leads and other objects can deform the chip leads, necessitating difficult repair efforts or scrapping of an otherwise operational device. It would be advantageous to provide an anti-static package wherein the possibility of deforming such leads is minimized during shipping and handling.

Another difficulty to be overcome is that such an anti-static package should be able to accept electronic devices of a range of sizes and not just one specific size. Such a feature would simplify the process of packaging electronic components by decreasing the number of different anti-static packages required to accommodate a variety of products in the allowed size range. At the same time the anti-static package must itself be readily capable of being packaged, in some instances, for further anti-static protection.

SUMMARY OF THE INVENTION

It is a primary object of this invention to provide an improved anti-static package which permits a user to manipulate electronic components sensitive to electrostatic charges and discharge without any damage to the components from electrostatic charges.

It is a further object of the invention to provide improved protection against electrostatic discharges through a user inserting or removing sensitive electronic components from the package.

It is a still further object of the invention to use the anti-static package itself to allow a user to physically manipulate an electronic component while reducing the risk of damage by electrostatic charges.

It is yet another object of the invention to use the anti-static package itself to ease its opening and closing.

Another object of the invention is to provide an improved anti-static package whose manipulation of the electronic component does not create a significant amount of residue on the surface of the electronic component.

Still another object of the invention is to provide an improved anti-static package that does not itself create a significant amount of electrostatic charges when manipulating the electronic component.

A further object of this invention is to provide an improved anti-static package in which leads on the electronic component are inhibited from making direct contact with a surface of the package.

Still another object of this invention is to provide an improved anti-static package capable of holding an electronic component selected from a range of sizes and shapes.

Yet another object of this invention is to provide an improved anti-static package that itself can be readily contained within another anti-static container.

Other objects and advantages of the invention will be apparent from the following detailed description and the accompanying drawings.

In accordance with the present invention, the foregoing objectives are realized by providing an anti-static package for protecting sensitive electronic components from electrostatic charges, the anti-static package being thermoformed from an electrostatic dissipative plastic into a container body and a lid adapted to the container body. The bottom of the container body has a raised pedestal formed in the center for elevating and holding an enclosed electronic component's leads away from the surrounding portion of the bottom. A rectangular shaped compressible member made of a resilient foamed plastic is attached to the inside surface of the lid above the pedestal in order to secure the electronic component between the pedestal and the compressible member for shipping. The compressible member has a specially selected anti-static adhesive attached to its lower side for forming a releasable adhesive bond with the electronic component. When the electronic component is adhesively bonded to the lid through the compressible member, the user can lift the electronic component with the lid in order to relocate it to any desired location. The lid has two depressions formed in its outside surface which are adapted to receive the user's fingers. The two finger depressions form corresponding camming surfaces on the inner side of the lid which are positioned on either side of the compressible member. When the user inserts their fingers into the finger depressions and squeezes the lid, the lid easily becomes deformed which in turn eases separation of the lid from the container body. After the user has relocated the electronic component attached to the lid to a desired location, the user increases the force used to squeeze the lid, causing the two camming surfaces to contact the attached electronic component and forcibly break the releasable adhesive bond by pushing the electronic component away from the lid, thereby severing the electronic component from the lid. The releasable adhesive was specially selected for its anti-static properties and the substantial lack of adhesive residue left on the electronic component after the adhesive bond is broken.

DETAILED DESCRIPTION OF THE PREFERRED EMBODIMENTS

Figure 1:
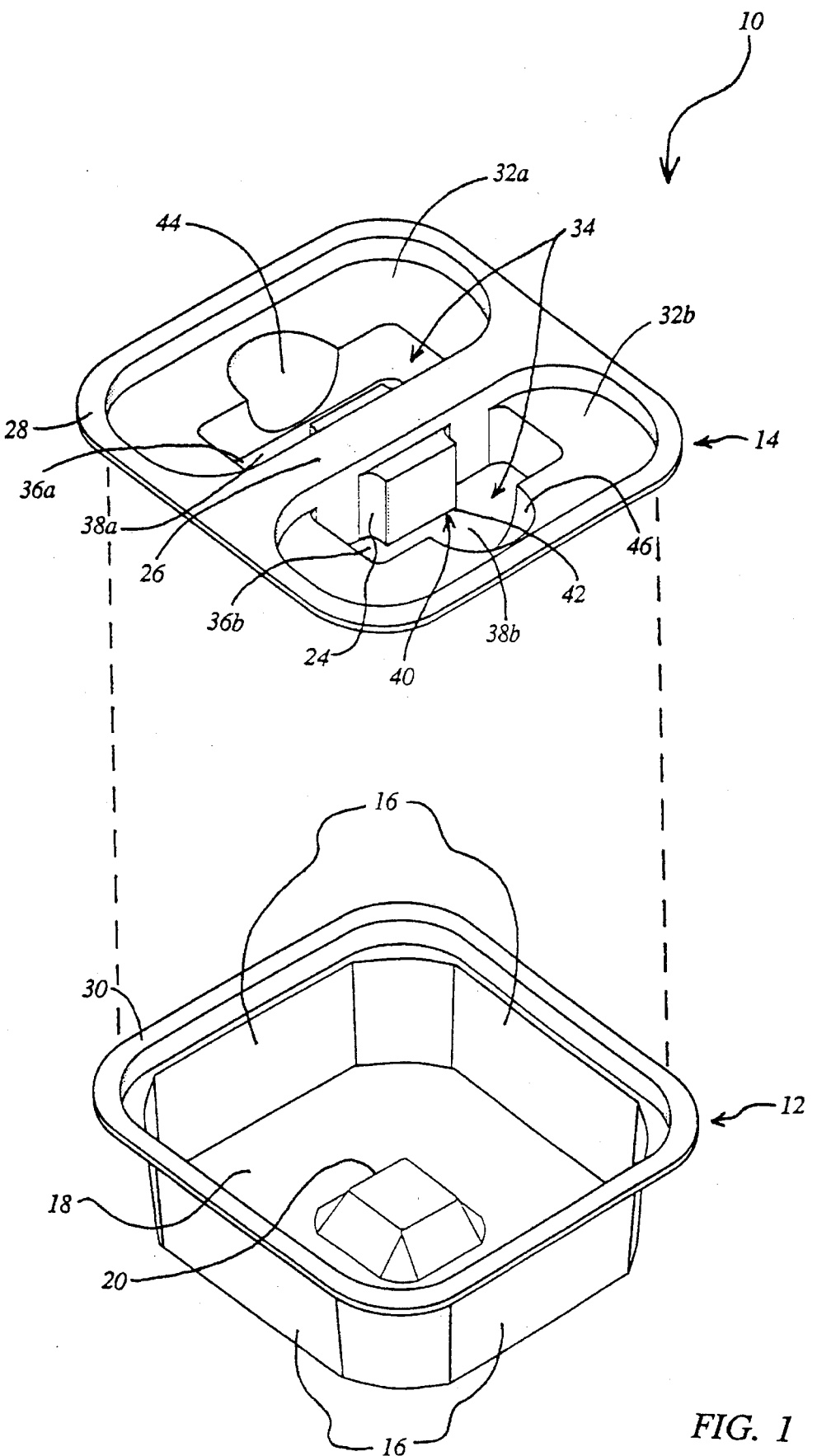
FIG. 1 is a perspective view of an anti-static package according to a preferred embodiment of the present invention.

While the invention is susceptible to various modifications and alternative forms, a specific embodiment thereof has been shown by way of example in the drawings and will be described in detail herein. It should be understood, however, that it is not intended to limit the invention to the particular forms disclosed. On the contrary, the intention is to cover all modifications, equivalents and alternatives falling within the spirit and scope of the invention as defined by the appended claims.

Figure 8:
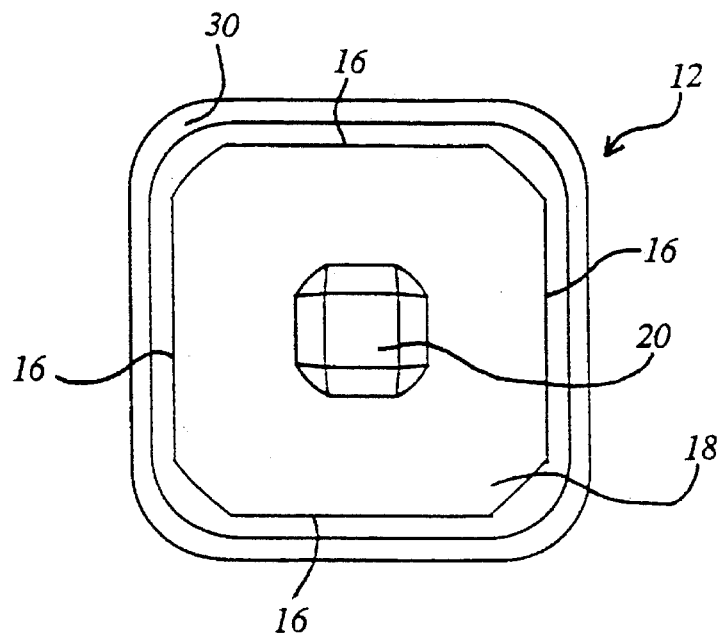
FIG. 8 is a plan view of the top of the container body of an anti-static package according to a preferred embodiment of the present invention.
Figure 9:
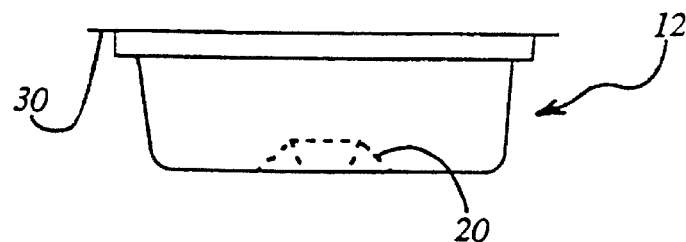
FIG. 9 is plan view of the side of the container body of an anti-static package according to a preferred embodiment of the present invention.

Turning now to the drawings and referring first to FIG. 1, there is shown an improved anti-static package 10 made of electrostatic dissipative thermoformed plastic. Thermoformed plastic was chosen because it permits relatively easy and inexpensive fabrication of the anti-static package 10 which has multi-faceted surfaces. The anti-static package 10 is electostaticly dissipative in order to prevent the accumulation of electrostatic charges on the package to protect the contents of the package from electrostatic discharges. Although the anti-static package 10 may be fabricated as a unitary plastic body, in the preferred embodiment PENTASTAT™ SC 660/05 Vinyl Rigid Film sold by Klockner Pentaplast of America, Inc. of Gordonsville, Va. is used to fabricate a container body 12 and a lid 14 adapted to the container body 12 which together make up the anti-static package 10. The container body 12 has four sides 16 with rounded corners, and an annular bottom 18. As illustrated in FIGS. 1, 8 and 9, the annular bottom 18 is formed around a raised pedestal 20 for elevating and holding the leads of an enclosed electronic component (not shown in FIG. 1, refer to 22 in FIGS. 2, 3 and 4) away from the annular bottom 18. The raised pedestal 20 helps to isolate the leads of the electronic component 22, thus preventing damage to the leads from direct contact with the anti-static package 10 itself.

The lid 14 has a central containment area 24 formed on the inner lid surface to partially enclose a compressible member 26. The central containment area 24 is centrally located on the lid 14 above the raised pedestal 20 when the anti-static package 10 is closed, and has opposing walls between which the compressible member 26 resides. The central containment area 24 functions to provide a place to attach, contain and compress the resilient compressible member 26.

In the preferred embodiment the compressible member 26 is rectangular in shape and made of a resilient foamed plastic. The compressible member 26 is attached within the central containment area 24 by an adhesive (not shown), and is thereby positioned above the raised pedestal 20 when the anti-static package 10 is closed.

The container body 12 and the lid 14 have corresponding mating ridges, a lid mating ridge 28 on the lid 14 and a container mating ridge 30 on the container body 12, that permit the container body 12 and the lid 14 to engage each other to become attached. The outside diameter of the vertical wall of the ridge 28 on the lid 14 is selected to match the inside diameter of the vertical wall of the ridge 30 on the container body 12 so the lid 14 can be attached to the container body 12 in a snug fit. When the mating ridges 28,30 are engaged, the anti-static package 10 is closed and some force is required to open it. The lid mating ridge 28 is formed in the lid 14 by the outer perimeters of a first shallow depression 32a and a second shallow depression 32b on opposite sides of the central containment area 24.

The opposed walls of the central containment area 24 are partially encompassed by a cavity 34. In a preferred embodiment the cavity 34 is made up of a first finger depression 36a and a second finger depression 36b in the lid's 14 outer surface. The two finger depressions 36a,36b are formed within the two shallow depressions 32a,32b. The two finger depressions 36a,36b are each adapted to receive at least one finger. The central containment area 24 is bounded on opposite sides by the two finger depressions 36a,36b to allow the compressible member 26 within the central containment area 24 to be compressed when the user's fingers in the two finger depressions 36a,36b are moved toward each other in a squeezing motion. Note that for purposes of this specification the thumb is considered to be a finger. The bottoms of the depressions 36a and 36b form first and second camming surfaces 38a and 38b on opposite sides of the compressible member 26.

Figure 2:
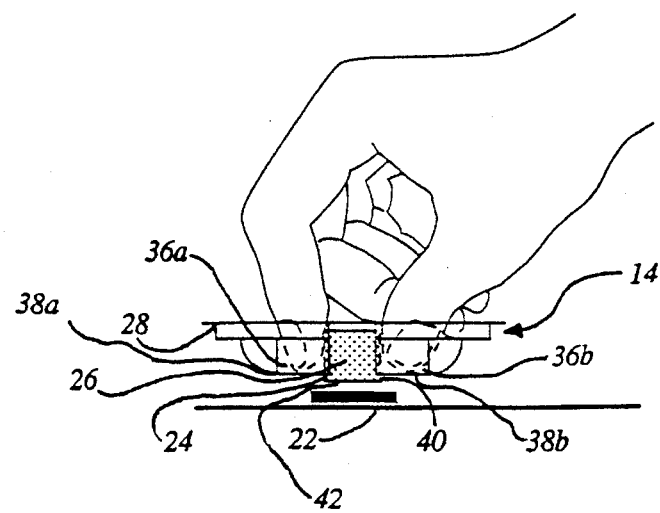
FIG. 2 is a side view of a user's hand positioning a lid of an anti-static package according to a preferred embodiment of the present invention above an electronic component.
Figure 6:
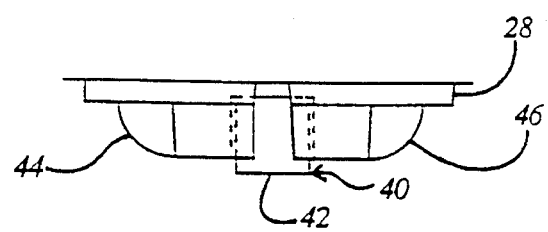
FIG. 6 is plan view of the side of the lid of an anti-static package according to a preferred embodiment of the present invention.
Figure 7:
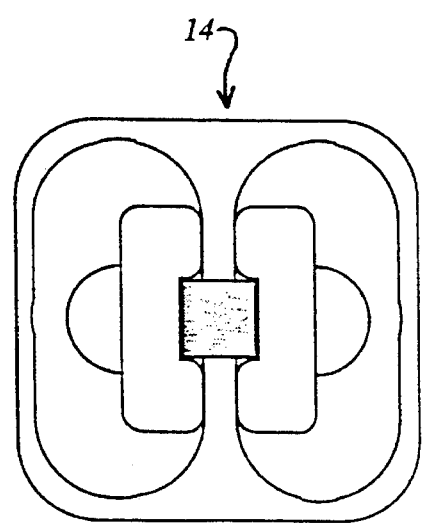
FIG. 7 is plan view of the bottom of the lid of an anti-static package according to a preferred embodiment of the present invention.

As shown in FIG. 2, the compressible member 26 has a device-holding side 40 that faces away from the lid 14. As seen in FIGS. 2 and 6, the compressible member 26 extends below the plane of the two camming surfaces 38a,38b, thereby holding the device-holding side 40 below the two camming surfaces 38a,38b. As illustrated in FIGS. 2, 3, 4, 6, and 7, an adhesive 42 is attached to the device-holding side 40. In a preferred embodiment, the film side of 3M SCOTCH™ 40 Anti-Static Utility Tape, sold by 3M, is attached to the device-holding side 40 with a double-sided adhesive tape, thereby leaving the adhesive side of the anti-static tape exposed and facing away from the lid 14.

As seen in FIG.2, the user has positioned the compressible member 26 above the electronic component 22. The device-holding side 40 is extended below the plane of the two camming surfaces 38a,38b to enable the user to first bring the adhesive 42 into contact with the electronic component 22. As the user continues to bring the lid 14 closer to the electronic component 22, the compressible member 26 is compressed. Pressure created between the now compressed compressible member 26 and the electronic component 22 serves to strengthen an adhesive bond between the adhesive 42 and the electronic component 22.

FIG. 2 illustrates how the lid 14 is adapted to be held by the user's hand. Typically, the user places a thumb and at least one other finger in the two finger depressions 36a,36b, with at least one finger per depression, in order to hold and manipulate the lid 14. The lid 14 enables the user to relocate an adhesively bonded electronic component 22 as desired by the user and reduces the risk of damage from electrostatic charges. FIG. 2 illustrates the user's hand positioning the lid 14 just above an electronic component 22. The user lowers the lid 14 to bring the adhesive 42 on the device-holding side 40 into contact with the electronic component 22 as described above. The user preferably continues to bring the lid 14 closer to the electronic component 22 until the two camming surfaces 38a,38b contact the surface of the electronic component 22, although this is not essential to form an adequate adhesive bond. Because the plastic forming the two camming surfaces 38a,38b requires substantially more force to deform than is required to compress the compressible member 26, the user knows he or she can stop pushing the lid closer to the electronic component 22 when the two camming surfaces 38a,38b contact the electronic component 22. This signals to the user that an adhesive connection has been formed between the electronic component 22 and the lid 14. At this point, if the lid 14 and electronic component 22 are otherwise free to be moved, the user lifts the electronic component 22 and relocates it as desired, without directly touching the electronic component 22, because it is attached to the other side of the lid 14. Because the lid 14 is between the operator's hand and the electronic component 22 the risk of damage to the electronic component 22 from electrostatic charges is greatly reduced.

Figure 3:
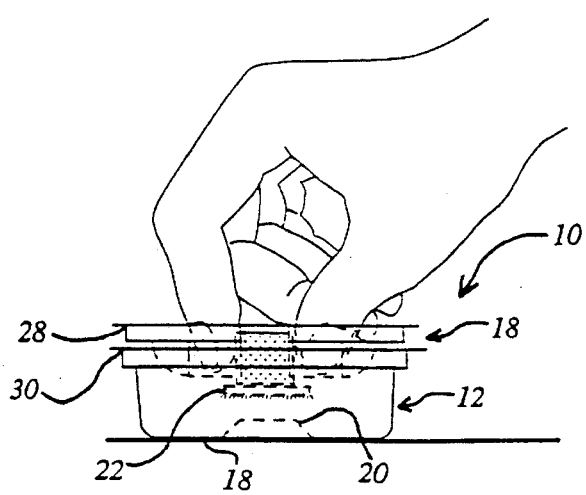
FIG. 3 is a side view of a user's hand positioning a lid of an anti-static package according to a preferred embodiment of the present invention, with the electronic component attached to the lid, above the container body.

Once the electronic component 22 is attached to the lid 14 as described above, the electronic component 22 may be positioned above the raised pedestal 20 in the container body 12. In FIG. 3 the user has positioned the electronic component 22 just above the raised pedestal 20. To fully close the anti-static package 10 the user must align the lid mating ridge 28 with the container mating ridge 30, and then lower the lid 14 to engage the mating ridges 28,30 (FIG. 3). The anti-static package 10 is designed such that when the mating ridges 28,30 are fully engaged to close the anti-static package 10, the electronic component 22 is resting on the raised pedestal 20.

Figure 4:
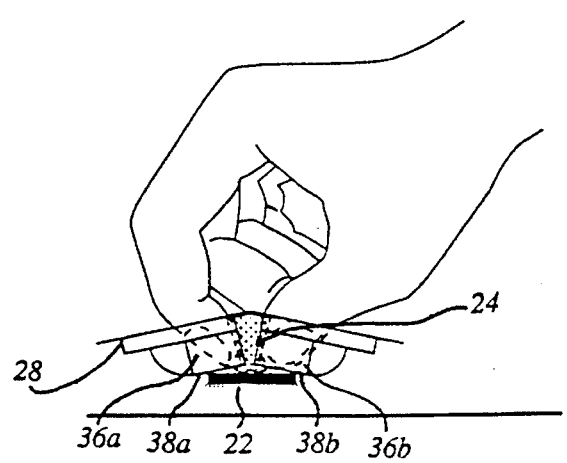
FIG. 4 is a side view of a user's hand squeezing a compressible member and deforming the shape of the lid.

The user can easily open the anti-static container 10 by gently squeezing the lid 14 until the lid 14 bends to separate it from the body 12 and then lifting the lid 14 off the container body 12. FIG. 4 illustrates a user squeezing the central containment area 24 of the lid 14. As shown in FIG. 4 the user has inserted two fingers, one in each of the two finger depressions 36a,36b, and is compressing the central containment area 24. The user squeezes the first and second finger depression 36a and 36b together such that the lid 14 deforms as shown, causing the camming surfaces 38a and 38b to contact the electronic component 22. At this point the lid 14 is easily removable from the container body 12, but the electronic component 22 is still attached by the adhesive 32 to the lid 14. As illustrated in FIG. 4, the lid 14 is designed so that it can bend along an axis in the plane of the lid 14 and generally running between the two shallow depressions 32a,32b and the two finger depressions 36a,36b. The exact location of the axis of bending is not critical.

Figure 5:
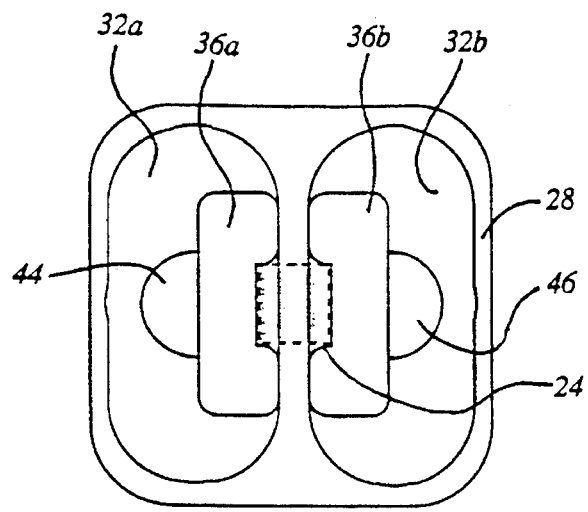
FIG. 5 is a plan view of the top of the lid of an anti-static package according to a preferred embodiment of the present invention.

The symmetry of the two finger depressions 36a,36b can be clearly seen (FIG. 5). The two finger depressions 36a,36b form a pair of side lobes 44 and 46 which help adapt the lid 14 to manipulation by the user's fingers by providing a surface area more closely conforming to the user's fingers to give the user greater leverage when squeezing the lid 14.

Figure 10:
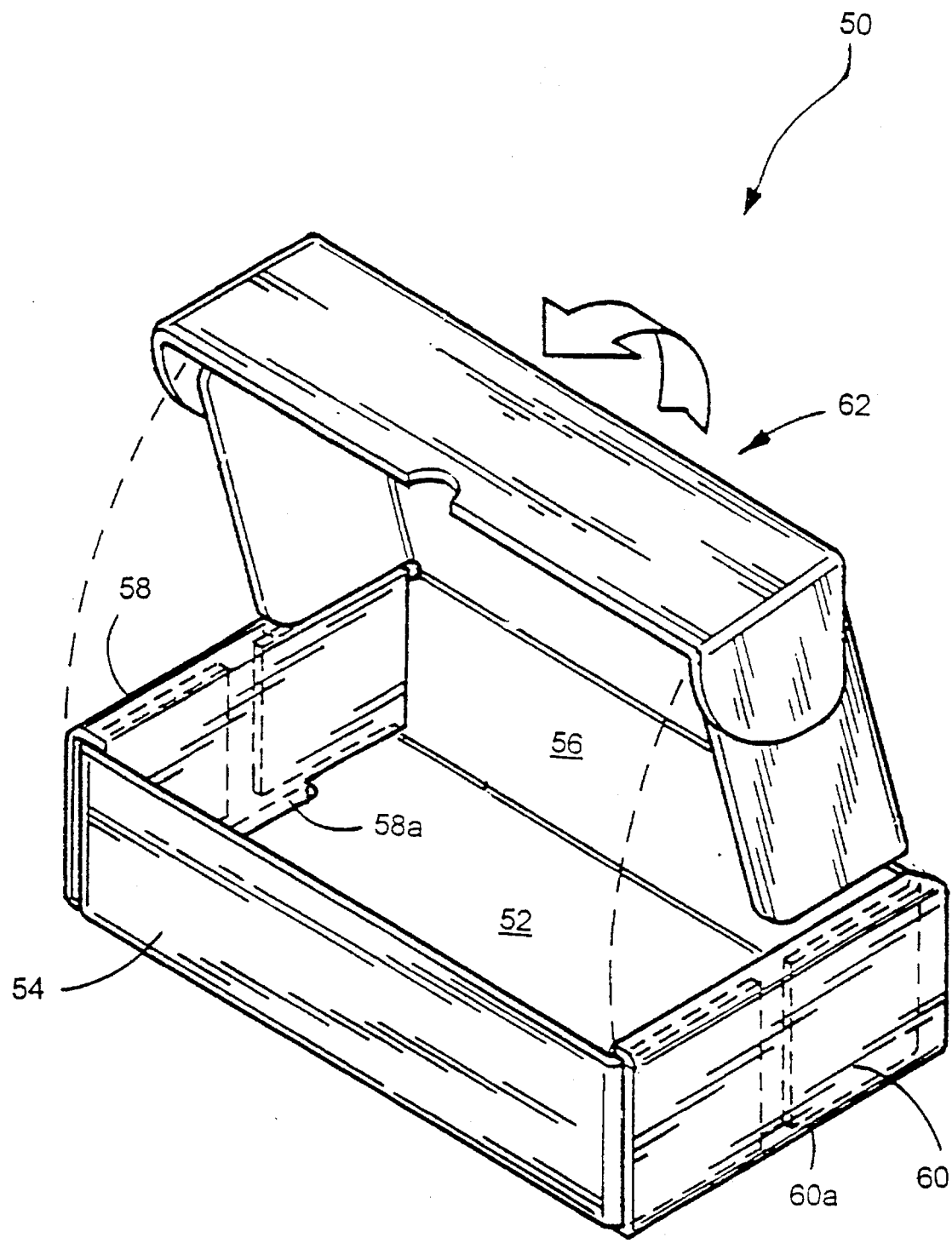
FIG. 10 is a perspective view of an anti-static box container for enclosing an anti-static package according to a preferred embodiment of the present invention.

To further reduce the risk of damage to the electronic component 22 from electrostatic charges, it is preferred to enclose the anti-static package 10 inside an anti-static box container 50 such as a corrugated fiberboard container shown in FIG. 10 and described in more detail in U.S. Pat. No. 5,107,989, incorporated herein by reference.

FIG. 10 illustrates the anti-static box container 50 as a paperboard or paper box having an electrically conductive coating on its exterior surface, and a coating of electrostatic dissipative material its interior surface. The electrically conductive coating preferably has an electrical surface resistivity of less than about $10^5$ ohms/square, and the inorganic, non-carbonaceous, electrostatic dissipative coating has an electrical surface resistivity of greater than about $10^5$ ohms/square. The electrostatic shielding material is preferably a carbonaceous material, and the electrostatic dissipative material preferably comprises particles of amorphous silica or silica-containing material coated with antimony-doped tin oxide. The surface resistivity of the carbonaceous coating is preferably in the range of from about $10^2$ to about $10^4$ ohms/square so that it forms an effective electrostatic shield and also quickly dissipates any charge that forms on, or comes into contact with, the coated surface. If desired, the conductive coating may be over-coated with a protective sealant, which is usually transparent.

The anti-static box container 50 includes a bottom panel 52, front and rear walls 54 and 56, a pair of end walls 58 and 60 and a lid 70. Each of the end walls 58 and 60 are formed from two panels of the paperboard blank, with the lower edge of the inside panel of each end wall forming a depending tab 58a or 60a which fits into a corresponding aperture in the bottom panel 52 so as to lock the end walls in place. The two panels of each end wall 58 and 60 form an interior cavity which receives end tabs from both the front wall 54 and the rear wall 56; and these end tabs are locked in place within the end wall after the depending tabs 58a and 60a on the inside panels of the end walls 58 and 60 have been inserted into the corresponding apertures in the bottom panel 52.

It is within the scope of this invention to vary the form factor of the anti-static box container 50 to allow enclosure of various sized anti-static packages to accommodate a range of sizes or multiple electronic components 22.

We claim:

1. An anti-static package for containing and manipulating an electronic component susceptible to damage from electrostatic charges, said anti-static package adapted for manipulation of said electronic component by a user's fingers through said package itself, comprising:

a container body, a lid adapted to fit onto the container body, a compressible member secured to the central portion of the lower surface thereof, a coating of releasable adhesive on the lower surface of said compressible member, both said compressible member and said adhesive being static dissipative, and said lid forming a pair of depressions on opposite sides of said compressible member so that a user's thumb and finger can be inserted into said depressions to press the lower portions of a pair of side walls of said depressions into said compressible member while tilting the bottom walls of said depressions, to effect the release of an electronic component adhered to said adhesive coating without direct engagement of the electronic component by the user.

2. The container of claim 1 wherein said container body and said lid are each formed as a unitary plastic member.

3. The container of claim 2 wherein said container body and said lid are both thermoformed plastic parts.

4. The container of claim 1 wherein said compressible member is made of a foamed plastic.

5. The container of claim 1 wherein said compressible member is rectangular in shape.

6. The container of claim 1 wherein said depressions extend nearly to the bottom surface of said compressible member so that tilting of the bottom walls of said depressions lowers the outboard portions of said bottom walls below the bottom surface of said compressible member.

7. The anti-static package of claim 1 wherein said container body further comprises a raised pedestal elevated above a surrounding annular portion of said container body such that leads on an enclosed electronic component are spaced apart from the anti-static package.

8. The anti-static package of claim 1 wherein breaking of an adhesive bond between said adhesive and said electronic component does not leave substantial residue on said electronic component as a result of said adhesive bond.

9. The anti-static package of claim 1 wherein said releasable adhesive is selected such that after said electronic component has formed an adhesive bond with said lid and said adhesive bond is broken, a substantial electrostatic charge is not created as a result.

10. The anti-static package of claim 1 wherein said lower portions of a pair of side walls of said depressions form a pair of camming surfaces.

11. An anti-static package for containing and manipulating an electronic component susceptible to damage from electrostatic charges, said anti-static package adapted for manipulation by an operator's fingers of said electronic components through said package itself, comprising:

a container body, a lid adapted to fit onto the container body, a compressible member secured to the central portion of the lower surface thereof, a coating of releasable adhesive on the lower surface of said compressible member, both said compressible member and said adhesive being static dissipative, and a cavity formed in said outer lid surface of said lid, said cavity further comprising a first finger depression and a second finger depression positioned on opposite sides of said compressible member, said finger depressions adapted to said fingers for squeezing said compressible member such that said lid is deformed, thereby allowing easier removal of said lid from said container body when said anti-static package is closed.

12. The anti-static package of claim 10 wherein said container body and said lid are each formed as a unitary plastic member.

13. The container of claim 10 wherein said container body and said lid are both thermoformed plastic parts.

14. The anti-static package of claim 10 wherein said container body further comprises a raised pedestal elevated above a surrounding annular portion of said container body such that leads on an enclosed electronic component are spaced apart from the anti-static package.

15. The anti-static package of claim 10 wherein said compressible member is made of a foamed plastic.

16. The anti-static package of claim 10 wherein said compressible member is rectangular in shape.

17. The anti-static package of claim 10 wherein breaking of an adhesive bond between said adhesive and said electronic component does not leave substantial residue on said electronic component as a result of said adhesive bond.

18. The anti-static package of claim 10 wherein said releasable adhesive is selected such that after said electronic component has formed an adhesive bond with said lid and said adhesive bond is broken, a substantial electrostatic charge is not created as a result.

19. An anti-static package for containing and manipulating an electronic component susceptible to damage from electrostatic charges, comprising:

a container body, a lid adapted to fit onto the container body, a compressible member secured to the lower surface of said lid, said compressible member having a device holding side facing substantially away from said lid;

a coating of releasable adhesive on said device holding side of said compressible member, said adhesive being electrostatic dissipative or electrically conductive.

20. The anti-static package of claim 17 wherein breaking of an adhesive bond between said adhesive and said electronic component does not leave substantial residue on said electronic component as a result of said adhesive bond.

21. A method for relocating an electronic component to a desired location with an anti-static package manipulated by fingers, comprising:

forming a releasable adhesive bond between said electronic component and a lid having adhesive;

moving said lid and said adhesively bonded electronic component to said desired location;

squeezing said lid with said fingers such that a first camming surface and a second camming surface come into contact with said electronic component to break said adhesive bond.

22. The method of claim 21 wherein said adhesive is electrostatic dissipative or electrically conductive.

* * * * *